United States Patent
Endo (10) Patent No.: US 11,187,762 B2
(45) Date of Patent: Nov. 30, 2021

(54) MAGNETIC SENSOR AND METHOD OF MANUFACTURING MAGNETIC SENSOR

(71) Applicant: SHOWA DENKO K.K., Tokyo (JP)

(72) Inventor: Daizo Endo, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 61 days.

(21) Appl. No.: 16/621,332

(22) PCT Filed: Apr. 6, 2018

(86) PCT No.: PCT/JP2018/014689
§ 371 (c)(1),
(2) Date: Dec. 11, 2019

(87) PCT Pub. No.: WO2018/230116
PCT Pub. Date: Dec. 20, 2018

(65) Prior Publication Data
US 2021/0141035 A1    May 13, 2021

(30) Foreign Application Priority Data
Jun. 12, 2017  (JP) .............................. JP2017-115414

(51) Int. Cl.
*G01R 33/06* (2006.01)
*G01R 33/00* (2006.01)

(52) U.S. Cl.
CPC ....... *G01R 33/063* (2013.01); *G01R 33/0052* (2013.01)

(58) Field of Classification Search
CPC ......................... G01R 33/063; G01R 33/0052
(Continued)

(56) References Cited

U.S. PATENT DOCUMENTS 5,772,794 A * 6/1998 Uno ..................... G11B 5/3903
                                                     148/108
6,087,027 A * 7/2000 Hoshiya ................. B82Y 10/00
                                                     324/252
(Continued)

FOREIGN PATENT DOCUMENTS

JP    2008-205435 A    9/2008
JP    2008-249406 A    10/2008
(Continued)

OTHER PUBLICATIONS

International Search Report of PCT/JP2018/014689 dated Jun. 26, 2018 [PCT/ISA/210].
(Continued)

*Primary Examiner* — Christopher P McAndrew
(74) *Attorney, Agent, or Firm* — Sughrue Mion, PLLC (57) ABSTRACT

A magnetic sensor 1 is provided with: a thin film magnet 20 configured with a hard magnetic material and having magnetic anisotropy in an in-plane direction; a sensitive part 30 including a sensitive element 31 configured with a soft magnetic material and disposed to face the thin film magnet 30, the sensitive element 31 having a longitudinal direction in which a magnetic flux generated by the thin film magnet 20 passes through and a short direction, having uniaxial magnetic anisotropy in a direction crossing the longitudinal direction, and sensing a change in a magnetic field; and a control layer 102 disposed on a side of the thin film magnet 20 opposite to a side of the thin film magnet 20 on which the sensitive element 31 is provided, the control layer 102 controlling the magnetic anisotropy of the thin film magnet 20 to be directed in the in-plane direction.

10 Claims, 5 Drawing Sheets

(58) Field of Classification Search
USPC .......................................................... 324/244
See application file for complete search history.

(56) References Cited

U.S. PATENT DOCUMENTS

| | | | | |
|---|---|---|---|---|
| 6,118,621 | A * | 9/2000 | Ohsawa | B82Y 10/00 360/322 |
| 6,256,863 | B1 * | 7/2001 | Saito | G11B 5/3916 29/603.08 |
| 6,295,186 | B1 * | 9/2001 | Hasegawa | B82Y 25/00 360/324.11 |
| 6,313,973 | B1 * | 11/2001 | Fuke | B82Y 10/00 360/324.1 |
| 6,757,142 | B1 * | 6/2004 | Terunuma | B82Y 10/00 360/324.1 |
| 7,372,673 | B2 * | 5/2008 | Hayashi | B82Y 10/00 360/324.2 |
| 8,289,644 | B2 * | 10/2012 | Holmberg | B82Y 10/00 360/66 |
| 9,857,437 | B2 * | 1/2018 | Taylor | G01R 33/0052 |
| 2003/0053269 | A1 | 3/2003 | Nishiyama | |
| 2005/0054120 | A1 * | 3/2005 | Wakui | G01R 33/093 438/3 |
| 2005/0225907 | A1 * | 10/2005 | Hoshiya | B82Y 10/00 360/324.12 |
| 2007/0111035 | A1 * | 5/2007 | Shimizu | G11B 5/667 428/828.1 |
| 2009/0086372 | A1 * | 4/2009 | Ichihara | B82Y 10/00 360/135 |
| 2011/0068786 | A1 * | 3/2011 | Ohta | G01R 33/093 324/252 |
| 2012/0087045 | A1 * | 4/2012 | Yanagisawa | G11B 5/3912 360/294 |
| 2012/0231296 | A1 * | 9/2012 | Le | G01R 33/093 428/800 |
| 2013/0128381 | A1 * | 5/2013 | Okamura | G01R 33/093 360/75 |
| 2014/0111195 | A1 | 4/2014 | Kuo et al. | |
| 2014/0313843 | A1 * | 10/2014 | Nebashi | G06F 1/24 365/227 |
| 2015/0177286 | A1 | 6/2015 | Fuji et al. | |
| 2017/0178705 | A1 * | 6/2017 | Buhrman | G11C 11/1673 |
| 2018/0038899 | A1 | 2/2018 | Fuji et al. | |
| 2019/0189912 | A1 * | 6/2019 | Ebrahimi | H01L 43/02 |

FOREIGN PATENT DOCUMENTS

| | | |
|---|---|---|
| JP | 2015-125019 A | 7/2015 |
| JP | 2018-031274 A | 3/2018 |

OTHER PUBLICATIONS

Extended European Search Report dated Feb. 5, 2021, from the European Patent Office in application No. 18818217.4.

\* cited by examiner

MAGNETIC SENSOR AND METHOD OF MANUFACTURING MAGNETIC SENSOR

CROSS REFERENCE TO RELATED APPLICATIONS

This application is a National Stage of International Application No. PCT/JP2018/014689, filed Apr. 6, 2018, claiming priority to Japanese Patent Application No. 2017-115414, filed Jun. 12, 2017.

TECHNICAL FIELD

The present invention relates to a magnetic sensor and a method of manufacturing the magnetic sensor.

BACKGROUND ART

As a conventional art described in a gazette, there exists a magnetic impedance effect element provided with a thin-film magnet composed of a hard magnetic film formed on a nonmagnetic substrate, an insulating layer covering the upside of the thin-film magnet, a magneto-sensitive part composed of one or plural rectangular soft magnetic films formed on the insulating layer and imparted with uniaxial anisotropy, and a conductor film for connecting the plural soft magnetic films of the magneto-sensitive part electrically. In a longitudinal direction of the magneto-sensitive part, both ends of the thin-film magnet are located outside both ends of the magneto-sensitive part. The insulating layer has openings above the respective ends of the thin-film magnet. On the insulating layer, a yoke section composed of a soft magnetic film is formed ranging from the ends of the thin-film magnet over to the vicinities of the ends of the magneto-sensitive part via the openings of the insulating layer (refer to Patent Document 1).

CITATION LIST

Patent Literature

Patent Document 1: Japanese Patent Application Laid-Open Publication No. 2008-249406

SUMMARY OF INVENTION

Technical Problem

By the way, in the magnetic sensor using the magnetic impedance effect element, the bias magnetic field is applied to the magnetic impedance effect element to cause the impedance of the magnetic impedance effect element to linearly change with respect to the change of the external magnetic field. Examples of the method of generating the bias magnetic field include a method using the thin film magnet. By use of the thin film magnet, it is unnecessary to provide a coil for generating the magnetic field. The magnetic anisotropy in the in-plane direction is required of such a thin film magnet.

The present invention provides a magnetic sensor and so forth that are likely to cause a thin film magnet to generate magnetic anisotropy in an in-plane direction, as compared to the case in which a control layer is not used.

Solution to Problem

A magnetic sensor to which the present invention is applied includes: a thin film magnet that is configured with a hard magnetic material and has magnetic anisotropy in an in-plane direction; a sensitive part including a sensitive element that is configured with a soft magnetic material and is disposed to face the thin film magnet, the sensitive element having a longitudinal direction in which a magnetic flux generated by the thin film magnet passes through and a short direction, having uniaxial magnetic anisotropy in a direction that crosses the longitudinal direction, and sensing a change in a magnetic field; and a control layer that is disposed on a side of the thin film magnet, which is opposite to a side of the thin film magnet on which the sensitive element is provided, the control layer controlling the magnetic anisotropy of the thin film magnet to be directed in the in-plane direction.

In such a magnetic sensor, the control layer has a bcc structure, the hard magnetic material constituting the thin film magnet has an hcp structure, and, in the hard magnetic material, crystal growth is conducted on the bcc structure of the control layer to cause a c-axis of the hcp structure to be oriented in-plane. Moreover, the control layer is made of Cr, Mo or W, or an alloy containing thereof. With the above, it becomes possible to control orientation of the hard magnetic material constituting the thin film magnet with ease.

Then, the control layer is disposed on a nonmagnetic substrate provided with a groove along a direction connecting both magnetic poles of the thin film magnet. With this, it becomes possible to control orientation of the hard magnetic material constituting the thin film magnet with more ease.

And also, an adhesive layer is provided between the substrate and the control layer, the adhesive layer improving adhesiveness of the control layer to the substrate. With this, the stability is improved.

Further, the sensitive element of the sensitive part is configured with plural soft magnetic material layers that are antiferromagnetically-coupled with a demagnetizing field suppressing layer made of Ru or an Ru alloy interposed therebetween. With this, the magnetic impedance effect is improved.

Still further, the sensitive part includes the plural sensitive elements disposed in parallel, and the sensitive part is configured with the plural sensitive elements serially connected by at least one connection member made of a conductor. With this, the sensitivity is improved.

Then, a yoke is provided, from a magnetic pole of the thin film magnet, to face an end portion in the longitudinal direction of the sensitive element in the sensitive part to guide the magnetic flux generated from the thin film magnet to pass through the sensitive element in the longitudinal direction thereof. This makes it possible to apply the bias magnetic field effectively.

From another standpoint, a method of manufacturing a magnetic sensor, to which the present invention is applied, includes: a control layer formation process that forms a control layer on a nonmagnetic substrate, the control layer controlling magnetic anisotropy of a hard magnetic material layer to be formed on the control layer to be directed in an in-plane direction; a thin film magnet formation process that forms the hard magnetic material layer to serve as a thin film magnet on the control layer, the magnetic anisotropy of the hard magnetic material layer being controlled by the control layer to be directed in the in-plane direction; and a sensitive part formation process that forms a soft magnetic material layer to face the hard magnetic material layer with an insulating layer interposed therebetween, and forms a sensitive part including a sensitive element having uniaxial magnetic anisotropy in a direction crossing a direction in which a magnetic flux generated by the thin film magnet passes through.

In such a method of manufacturing a magnetic sensor, the substrate in the control layer formation process has a groove formed thereon along a direction connecting both magnetic poles of the thin film magnet. With this, it becomes possible to control orientation of the hard magnetic material constituting the thin film magnet with more ease.

Advantageous Effects of Invention

According to the present invention, it is possible to provide a magnetic sensor and so forth that are likely to cause a thin film magnet to generate magnetic anisotropy in an in-plane direction, as compared to the case in which a control layer is not used.

BRIEF DESCRIPTION OF DRAWINGS

FIGS. 1A and 1B show diagrams illustrating an example of a magnetic sensor to which a first exemplary embodiment is applied, where

FIGS. 2A to 2G show diagrams illustrating an example of a method of manufacturing the magnetic sensor, where

FIGS. 3A and 3B show diagrams illustrating an example of a magnetic sensor to which a second exemplary embodiment is applied, where

FIGS. 4D to 4J show diagrams illustrating an example of a method of manufacturing the magnetic sensor, where FIGS. 5A and 5B show diagrams illustrating an example of a magnetic sensor to which a third exemplary embodiment is applied, where

DESCRIPTION OF EMBODIMENTS

The magnetic sensor to be described in the present specification uses a so-called magnetic impedance effect element.

Hereinafter, exemplary embodiments according to the present invention will be described in detail with reference to attached drawings.

First Exemplary Embodiment

Figure 1A:
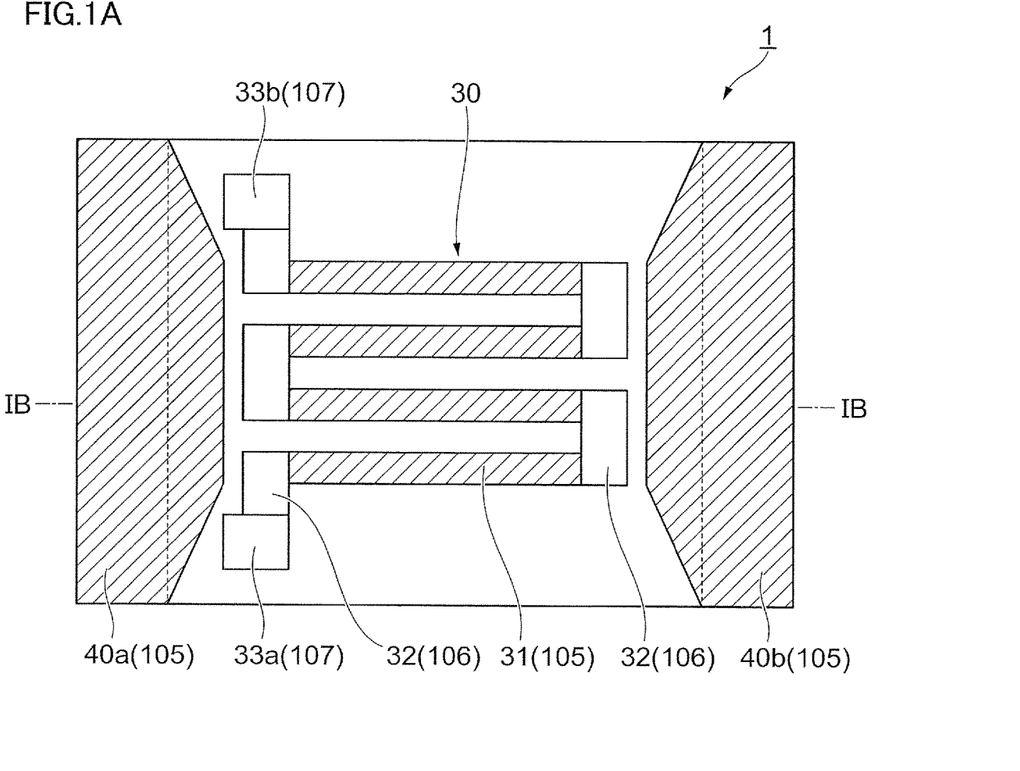
FIG. 1A is a plan view and FIG. 1B is a cross-sectional view along the 1B-1B line in FIG. 1A.
Figure 1B:
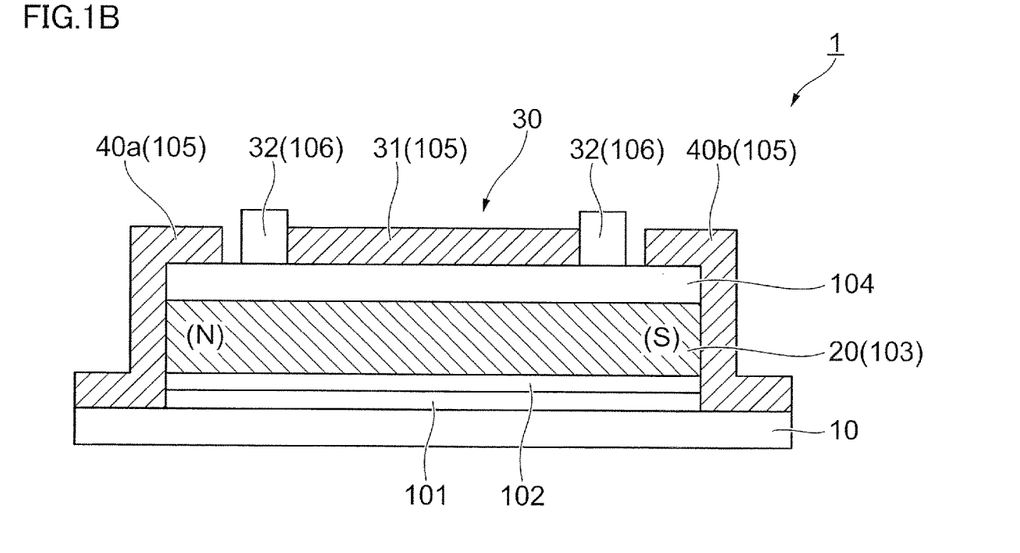

FIGS. 1A and 1B show diagrams illustrating an example of a magnetic sensor 1 to which a first exemplary embodiment is applied. FIG. 1A is a plan view and FIG. 1B is a cross-sectional view along the IB-IB line in FIG. 1A.

As shown in FIG. 1B, the magnetic sensor to which the first exemplary embodiment is applied includes: a thin film magnet 20 configured with a hard magnetic material (a hard magnetic material layer 103); a sensitive part 30 that is provided to face the thin film magnet 20 and is configured to contain a soft magnetic material (a soft magnetic material layer 105) to sense changes in a magnetic field (an external magnetic field); and a control layer 102 that controls to cause magnetic anisotropy of the thin film magnet 20 to be expressed in an in-plane direction of the film. The control layer 102 is provided on a side of the thin film magnet 20, which is opposite to the side on which the sensitive part 30 is provided. Note that, in the present specification, a layer constituting the thin film magnet 20, here, the hard magnetic material layer 103, is noted in brackets. The same is true in other cases.

As shown in FIG. 1A, the sensitive part 30 includes: plural reed-shaped sensitive elements 31 each having a longitudinal direction and a short direction; connection members 32 each configured with a conductor (a conductor layer 106) that windingly performs serial connection of end portions of the adjacent sensitive elements 31. The plural sensitive elements 31 are arranged with the longitudinal direction thereof in parallel with one another. Moreover, an end portion with no adjacent sensitive element 31 is also provided with the connection member 32. Further, the sensitive part 30 includes electrode pads 33a and 33b (when they are not distinguished, collectively referred to as an electrode pad 33 (a conductor layer 107)) for energization at both end portions of the sensitive elements 31 serially connected by the connection members 32 (the connection members 32 at end portions with no adjacent sensitive elements 31). Note that, in FIG. 1A, the sensitive part 30 includes four sensitive elements 31 as an example; however, there may be a single sensitive element or plural sensitive elements other than four. The sensitive element 31 serves as the magnetic impedance effect element.

Further, as shown in FIG. 1B, the magnetic sensor 1 includes a yoke 40a that guides the magnetic flux from a north pole of the thin film magnet 20 to an end portion in the longitudinal direction of the sensitive element 31 in the sensitive part 30 and a yoke 40b that guides the magnetic flux from the other end portion in the longitudinal direction of the sensitive element 31 in the sensitive part 30 to a south pole of the thin film magnet 20, to thereby cause the magnetic flux generated from the north pole and the south pole (in FIG. 1B, referred to as (N) and (S)) of the thin film magnet 20 to path through the sensitive element 31 of the sensitive part 30 in the longitudinal direction. The yokes 40a and 40b (when they are not distinguished, collectively referred to as a yoke 40) are configured with a soft magnetic material (a soft magnetic material layer 105) through which the magnetic flux can pass with ease. In other words, the thin film magnet 20 provides a bias magnetic field to the sensitive part 30. Note that the north pole and the south pole of the thin film magnet 20 are collectively referred to as both magnetic poles, and when the north pole and the south pole are not distinguished, they are referred to as a magnetic pole.

Next, with reference to FIG. 1B, the cross-sectional structure of the magnetic sensor 1 will be described in detail. The magnetic sensor 1 is configured by disposing (laminating) an adhesive layer 101, the control layer 102, the thin film magnet 20 (the hard magnetic material layer 103), an insulating layer 104 and the sensitive part 30 in this order on a nonmagnetic substrate 10. In each of the adhesive layer 101, the control layer 102, the thin film magnet 20 (the hard magnetic material layer 103) and the insulating layer 104, at least two facing side surfaces are processed to be exposed. Note that the at least two side surfaces to be exposed are set so that two side surfaces of the hard magnetic material layer 103 constituting the exposed thin film magnet 20 serve as the north pole and the south pole. Then, the yokes 40a and 40b are provided to contact the north pole and the south pole of the exposed thin film magnet 20, respectively, to thereby guide the magnetic flux to pass through the sensitive elements 31 in the longitudinal direction. Note that the yokes 40a and 40b may not be provided to contact the north pole and the south pole of the exposed thin film magnet 20, and there may be gaps. Note that, when the yokes 40a and 40b contact the north pole and the south pole of the exposed thin film magnet 20, leakage of the magnetic flux can be suppressed.

Note that, as shown in FIG. 1A, the yoke 40 (the yokes 40a and 40b) is configured so that the shape thereof as viewed from above the substrate 10 is narrowed as approaching the sensitive part 30. This is to concentrate the magnetic flux generated by the thin film magnet 20 onto the sensitive part 30 (to increase the magnetic flux density). In other words, the width of the north pole and the south pole of the thin film magnet 20 is made wider than the width of the portion in the sensitive part 30 where the plural sensitive elements 31 are provided, to thereby increase the bias magnetic field to the sensitive part 30. Consequently, the width of the portion of the yoke 40 (the yokes 40a and 40b) facing the sensitive part 30 may be set wider than the width of the portion in the sensitive part 30 where the plural sensitive elements 31 are provided. Note that the width of the portion of the yoke 40 (the yokes 40a and 40b) facing the sensitive part 30 may not be narrowed.

Here, the interval between the yoke 40 (the yokes 40a and 40b) and the end portion of the sensitive element 31 of the sensitive part 30 in the longitudinal direction may be, for example, 1 µm to 100 µm.

The substrate 10 is made of a nonmagnetic material, examples of which include a semiconductor substrate, such as silicon, and an oxide substrate, such as sapphire and glass.

The adhesive layer 101 improves adhesiveness of the control layer 102 to the substrate 10. As the adhesive layer 101, it is preferable to use an alloy containing Cr or Ni. Examples of the alloy containing Cr or Ni include CrTi, CrTa and NiTa. The thickness of the adhesive layer 101 is, for example, 5 nm 50 nm. Note that, if there is no problem in adhesiveness of the control layer 102 to the substrate 10, it is unnecessary to provide the adhesive layer 101. Note that, in the present specification, composition ratios of alloys are not particularly shown. The same applies hereinafter.

The control layer 102 controls the magnetic anisotropy of the thin film magnet 20 configured with the hard magnetic material layer 103 to express in the in-plane direction of the film. As the control layer 102, it is preferable to use Cr, Mo or W, or an alloy containing thereof (hereinafter, referred to as an alloy containing Cr or the like to constitute the control layer 102). Examples of the alloy containing Cr or the like to constitute the control layer 102 include CrTi, CrMo, CrV and CrW. The thickness of the control layer 102 is, for example, 5 nm 100 nm.

It is preferable that the hard magnetic material constituting the thin film magnet 20 (the hard magnetic material layer 103) uses an alloy that contains Co as a main component and also contains at least one of Cr and Pt (hereinafter, referred to as a Co alloy constituting the thin film magnet 20). Examples of the Co alloy constituting the thin film magnet 20 include CoCrPt, CoCrTa, CoNiCr and CoCrPtB. Note that Fe may be contained. The thickness of the hard magnetic material constituting the thin film magnet 20 (the hard magnetic material layer 103) is, for example, 50 nm to 500 nm.

The alloy containing Cr or the like to constitute the control layer 102 has a bcc (body-centered cubic) structure. Consequently, the hard magnetic material constituting the thin film magnet 20 (the hard magnetic material layer 103) preferably has an hcp (hexagonal close-packed) structure easily causing crystal growth on the control layer 102 composed of the alloy containing Cr or the like having the bcc structure. When crystal growth of the hard magnetic material layer 103 having the hcp structure is caused on the bcc structure, the c-axis of the hcp structure is likely to be oriented in-plane. Therefore, the thin film magnet 20 configured with the hard magnetic material layer 103 is likely to have the magnetic anisotropy in the in-plane direction. Note that the hard magnetic material layer 103 is polycrystalline, and each crystal has the magnetic anisotropy in the in-plane direction. Consequently, the magnetic anisotropy is referred to as crystal magnetic anisotropy in some cases.

Note that, to promote the crystal growth of the alloy containing Cr or the like to constitute the control layer 102 and the Co alloy constituting the thin film magnet 20, it is preferable that the substrate 10 is heated to 100° C. to 600° C. By the heating, the crystal growth of the alloy containing Cr or the like of the control layer 102 is caused, and thereby crystalline orientation is likely to be provided so that the hard magnetic material layer 103 having the hcp structure includes an axis of easy magnetization in-plane. In other words, the magnetic anisotropy is likely to be imparted in-plane of the hard magnetic material layer 103.

The insulating layer 104 is configured with nonmagnetic insulating material and electrically insulates the thin film magnet 20 and the sensitive part 30. Examples of the insulating material constituting the insulating layer 104 include oxide, such as $SiO_2$ or $Al_2O$, or nitride, such as $Si_2N_4$ or AlN. The thickness of the insulating layer 104 is, for example, 100 nm to 500 nm.

The sensitive element 31 in the sensitive part 30 is provided with uniaxial magnetic anisotropy in a direction crossing the longitudinal direction, for example, a direction at right angles, i.e. the width direction. As the soft magnetic material constituting the sensitive element 31 (the soft magnetic material layer 105), an amorphous alloy, which is an alloy containing Co as a main component (hereinafter, referred to as a Co alloy constituting the sensitive element 31) doped with a high melting point metal, such as Nb, Ta or W. Examples of the Co alloy constituting the sensitive element 31 include CoNbZr, CoFeTa and CoWZr. The thickness of the soft magnetic material constituting the sensitive element 31 (the soft magnetic material layer 105) is, for example, 0.5 µm to 5 µm.

The connection member 32 (the conductor layer 106) and the electrode pad 33 (the conductor layer 107) may be a conductor with excellent conductivity, and, for example, Cu, Au or Al can be used.

It is preferable that the yoke 40 (the yokes 40a and 40b) is composed of a soft magnetic material having high magnetic permeability. Here, the yoke 40 is configured with the soft magnetic material layer 105 that constitutes the sensitive element 31 of the sensitive part 30.

By providing the yoke 40, the magnetic flux generated from the thin film magnet 20 acts on the sensitive part 30 (the sensitive element 31) as the bias magnetic field via the yoke 40. By the yoke 40, leakage of the magnetic flux from the thin film magnet 20 is reduced, and thereby the bias magnetic field is effectively applied to the sensitive part 30 (the sensitive element 31). Due to the thin film magnet 20, it is unnecessary to provide a coil for generating the magnetic field. Consequently, it is possible to perform power saving and downsizing of the magnetic sensor 1.

Note that, similar to the sensitive elements 31 of the sensitive part 30, the thin film magnet 20 may be plural thin film magnet pieces that are provided to correspond to the respective sensitive elements 31. In other words, there may be a configuration in which the sensitive elements 31 are laminated on the thin film magnet pieces via the insulating layer 104. With this, a demagnetizing field generated inside the thin film magnet 20 is reduced, and thereby the magnetic flux generation efficiency from the thin film magnet 20 is increased.

(Method of Manufacturing Magnetic Sensor 1)

Next, an example of a method of manufacturing the magnetic sensor 1 will be described.

FIGS. 2A to 2G show diagrams illustrating an example of a method of manufacturing the magnetic sensor 1. FIGS. 2A to 2G show respective processes in the method of manufacturing the magnetic sensor 1. Note that FIGS. 2A to 2G show the representative processes, and the processes proceed in the order of FIGS. 2A to 2G. FIGS. 2A to 2G correspond to the cross-sectional view in FIG. 1B.

As described above, the substrate 10 is made of a non-magnetic material, examples of which include a semiconductor substrate, such as silicon, and an oxide substrate, such as sapphire and glass. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 20 configured with the hard magnetic material layer 103. By doing so, the crystal growth in the hard magnetic material layer 103 is promoted in the direction of the grooves. Consequently, the axis of easy magnetization of the thin film magnet 20 configured with the hard magnetic material layer 103 is more likely to face the groove direction (the direction connecting the north pole and the south pole of the thin film magnet 20. In other words, magnetization of the thin film magnet 20 becomes easier.

In the manufacturing method to be described as follows, a lift-off method is mainly used. Note that an etching method may also be used.

Figure 2A:
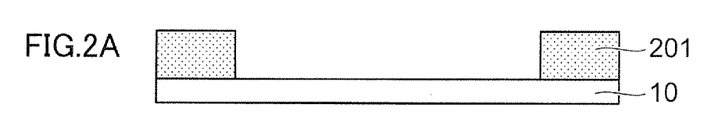
FIGS. 2A to 2G show respective processes in the method of manufacturing the magnetic sensor.

First, the substrate 10 is cleaned, and thereafter, as shown in FIG. 2A, on the one surface of the substrate 10 (hereinafter, referred to as a front surface), a resist pattern 201 including an opening for a portion where the thin film magnet 20 is formed is formed by a known photolithography.

Figure 2B:
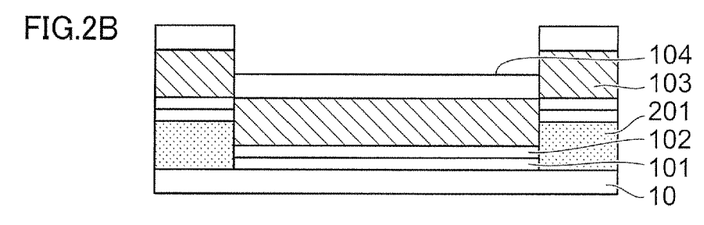

Next, as shown in FIG. 2B, on the front surface of the substrate 10 where the resist pattern 201 has been formed, the adhesive layer 101, the control layer 102 and the hard magnetic material layer 103 constituting the thin film magnet 20 are deposited (accumulated) in order. For example, by use of a sputtering method, a layer (a film) of an alloy containing Cr or Ni to constitute the adhesive layer 101, a layer (a film) of an alloy containing Cr or the like to constitute the control layer 102 and a layer (a film) of a Co alloy to constitute the hard magnetic material layer 103 are successively deposited (accumulated) in order. As described above, in forming the control layer 102 and the hard magnetic material layer 103, it is preferable to heat the substrate 10 to, for example, 100° C. to 600° C. for accelerating the crystal growth.

Here, the process of forming the control layer 102 is an example of a control layer formation process.

Note that, in deposition of the adhesive layer 101, the substrate 10 may be heated or may not be heated. To remove the moisture and so forth absorbed onto the substrate 10, the substrate 10 may be heated before the adhesive layer 101 is deposited.

Next, a layer (a film) of oxide, such as $SiO_2$ or $Al_2O$, or nitride, such as $Si_2N_4$ or AlN to constitute the insulating layer 104 is deposited (accumulated). Deposition of the insulating layer 104 can be performed by plasma CVD, a reactive sputtering method, or the like.

Figure 2C:
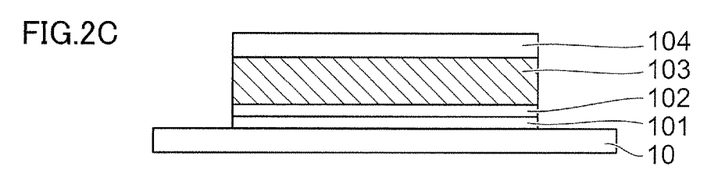

Then, as shown in FIG. 2C, by removing the resist pattern 201, portions of the adhesive layer 101, the control layer 102, the hard magnetic material layer 103 and the insulating layer 104 accumulated on the resist pattern 201 are also removed (lift-off). In this manner, the adhesive layer 101, the control layer 102, the hard magnetic material layer 103 and the insulating layer 104 are formed on the substrate 10. The hard magnetic material layer 103 serves as the thin film magnet 20.

Here, the process of forming the thin film magnet 20 by the hard magnetic material layer 103 by the process of forming the hard magnetic material layer 103 and the lift-off method is an example of a thin film magnet formation process. Note that the thin film magnet formation process may include a process of magnetization that will be described later.

Figure 2D:
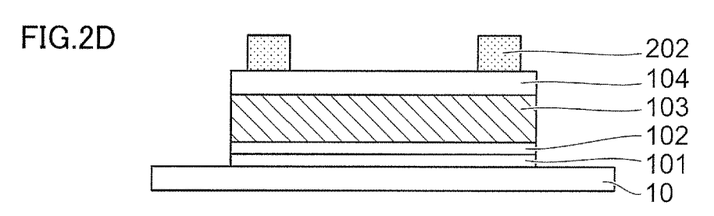

Next, as shown in FIG. 2D, the resist pattern 202, which has openings serving as the portions where the sensitive elements 31 in the sensitive part 30 and the yokes 40 (the yoke 40a and 40b) are formed, is formed on the substrate 10.

Figure 2E:
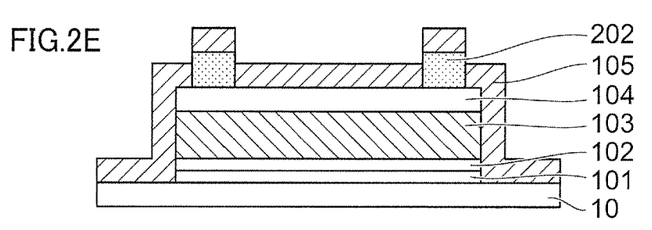

Then, as shown in FIG. 2E, on the substrate 10 where the resist pattern 202 has been formed, a film of the Co alloy, which serves as the soft magnetic material layer 105 to constitute the sensitive elements 31 and the yokes 40, is deposited (accumulated). The deposition is performed by using, for example, the sputtering method.

Figure 2F:
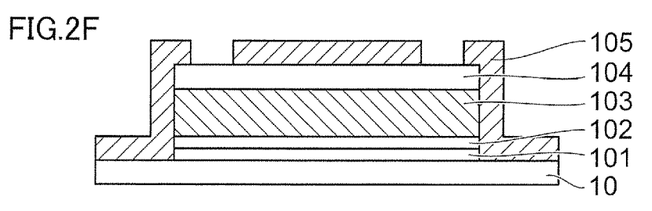

As shown in FIG. 2F, by removing the resist pattern 202, portions of the soft magnetic material layer 105 accumulated on the resist pattern 202 are also removed. The soft magnetic material layer 105 laminated on the thin film magnet 20 (the hard magnetic material layer 103) via the insulating layer 104 serves as the sensitive elements 31 in the sensitive part 30. Then, the soft magnetic material layer 104, a part of which is in contact with the north pole or the south pole of the thin film magnet 20 and the other part of which extends to face the sensitive elements 31 in the sensitive part 30, serves as the yokes 40 (the yokes 40a and 40b). In other words, the sensitive elements 31 in the sensitive part 30 and the yokes 40 are formed by a single deposition of the soft magnetic material layer 105.

Figure 2G:
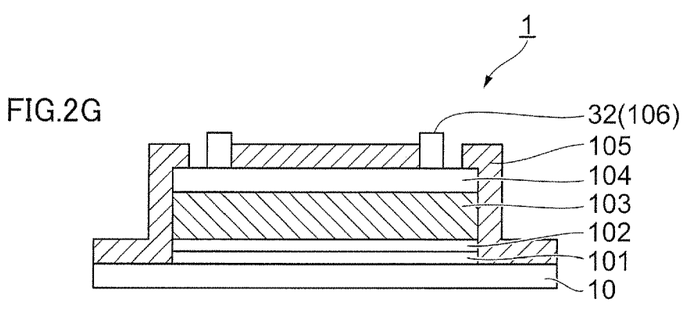

Next, as shown in FIG. 2G, the connection members 32 that windingly connect the end portions of the sensitive elements 31 are formed by a conductor, such as Cu, Au or Al. The connection members 32 can be formed by, for example, the sputtering method or the vacuum deposition method by use of a metal mask. Further, at the both end portions of the sensitive elements 31 that are serially-connected by the connection members 32, the electrode pads 33 (the electrode pads 33a and 33b, refer to FIG. 1) are formed by a conductor, such as Cu, Au or Al). The electrode pads 33 can be formed by the sputtering method or the vacuum deposition method by use of a metal mask. Here, the connection members 32 and the electrode pads 33 are formed in separate processes. This is because the electrode pad 33 is formed to be thicker than the connection member 32. If the thickness thereof is same, the connection members 32 and the electrode pads 33 may be formed in a single process.

Here, the process of forming the soft magnetic material layer 105, the process of forming the sensitive elements 31 configured with the soft magnetic material layer 105 by the lift-off, and the process of forming the connection members 32 and the electrode pads 33 are an example of a sensitive part formation process. Note that the sensitive part formation process may include a process of imparting the uniaxial magnetic anisotropy that will be described later.

Thereafter, the uniaxial magnetic anisotropy is imparted to the soft magnetic material layer 105 constituting the sensitive part 30 in the width direction of the sensitive elements 31. The impartation of the uniaxial magnetic anisotropy to the soft magnetic material layer 105 can be performed by heat treatment at 400° C. in a rotating magnetic field of, for example, 3 kG (0.3T) and by heat treatment at 400° C. in a static magnetic field of 3 kG (0.3T) subsequent thereto. At this time, the soft magnetic material layer 105 constituting the yokes 40 is provided with the similar uniaxial magnetic anisotropy. However, the yokes 40 just have to play a role of a magnetic circuit, and function even though the uniaxial magnetic anisotropy is imparted.

Next, the hard magnetic material layer 103 constituting the thin film magnet 20 is magnetized. For magnetizing the hard magnetic material layer 103, in the static magnetic field or in a pulsed magnetic field, a magnetic field larger than a coercive force of the hard magnetic material layer 103 is continuously applied until magnetization of the hard magnetic material layer 103 becomes saturated. Thus, the magnetized hard magnetic material layer 103 serves as the thin film magnet 20, and the magnetic flux from the thin film magnet 20 supplies the bias magnetic field to the sensitive part 30 via the yokes 40.

In this manner, the magnetic sensor 1 is manufactured.

Note that, in the case where the control layer 102 is not provided, it becomes necessary to impart the magnetic anisotropy in-plane by causing the crystal growth by heating the hard magnetic material layer 103 to not less than 800° C. after the hard magnetic material layer 103 was deposited. However, if the control layer 102, to which the first exemplary embodiment is applied, is provided, since the crystal growth is accelerated by the control layer 102, the crystal growth caused by heating to not less than 800° C. is not required.

Second Exemplary Embodiment

In a magnetic sensor 2 to which the second exemplary embodiment is applied, the sensitive element 31 in the sensitive part 30 is configured with two soft magnetic material layers provided with a demagnetizing field suppressing layer interposed therebetween. Hereinafter, portions different from those of the first exemplary embodiment will be mainly described, and similar portions will be assigned with same reference signs to thereby omit descriptions thereof.

(Magnetic Sensor 2)

Figure 3A:
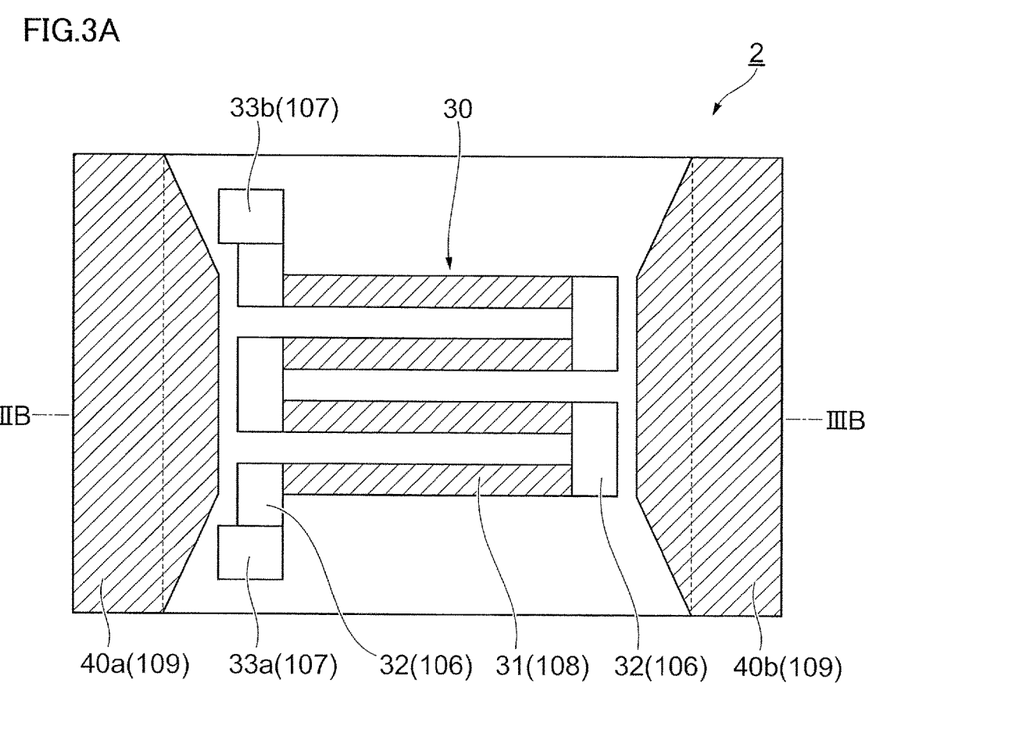
FIG. 3A is a plan view and FIG. 3B is a cross-sectional view along the IIIB-1IIB line in FIG. 3A.
Figure 3B:
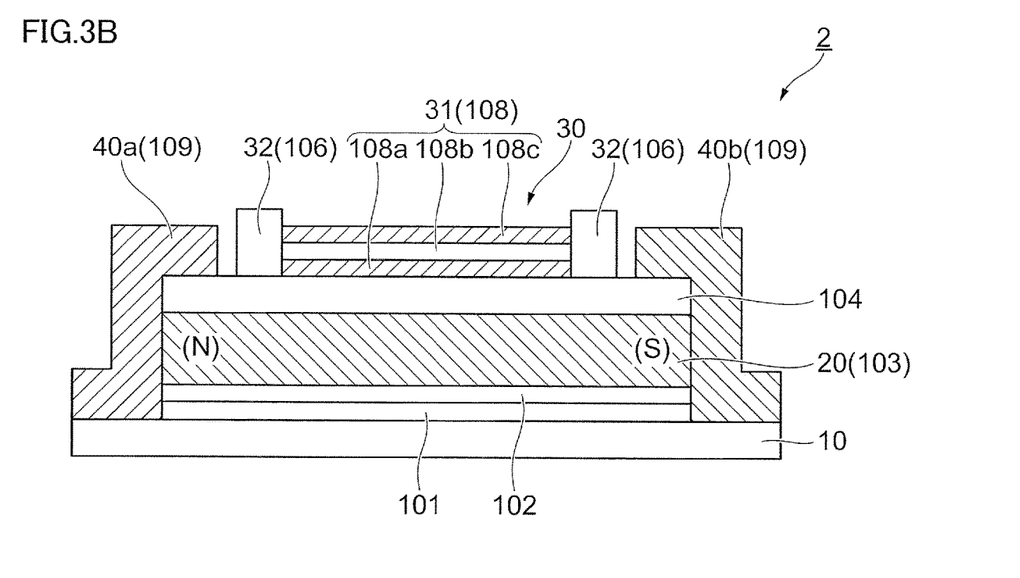

FIGS. 3A and 3B show diagrams illustrating an example of the magnetic sensor 2 to which the second exemplary embodiment is applied.

FIG. 3A is a plan view and FIG. 3B is a cross-sectional view along the IIIB-IIIB line in FIG. 3A.

In the magnetic sensor 2, the sensitive part 30 is different from that of the magnetic sensor 1 to which the first exemplary embodiment is applied.

As shown in FIG. 3B, in the magnetic sensor 2, a magnetic material layer 108 constituting the sensitive elements 31 in the sensitive part 30 includes a lower soft magnetic material layer 108a on a lower layer (the substrate 10) side, a demagnetizing field suppressing layer 108b and an upper soft magnetic material layer 108c on an upper layer (opposite to the substrate 10) side. In other words, the lower soft magnetic material layer 108a and the upper soft magnetic material layer 108c are provided with the demagnetizing field suppressing layer 108b interposed therebetween. For the lower soft magnetic material layer 108a and the upper soft magnetic material layer 108c, similar to the soft magnetic material constituting the sensitive elements 31 in the first exemplary embodiment, an amorphous alloy made of an alloy containing Co as the main component doped with a high melting point metal, such as Nb, Ta or W, can be used. Examples of the Co alloy include CoNbZr, CoFeTa and CoWZr. For the demagnetizing field suppressing layer 108b, Ru or an Ru alloy can be used.

Here, the thickness of the demagnetizing field suppressing layer 108b made of Ru or the Ru alloy ranging from 0.4 nm to 1.0 nm or from 1.6 nm to 2.6 nm provides an AntiFerromagnetically-Coupled (AFC) structure to the lower soft magnetic material layer 108a and the upper soft magnetic material layer 108c. In other words, the demagnetizing field is suppressed, and thereby sensitivity of the sensitive part 30 (the sensitive elements 31) is increased.

(Method of Manufacturing Magnetic Sensor 2)

FIGS. 4D to 4J shows diagrams illustrating an example of a method of manufacturing the magnetic sensor 2. FIGS. 4D to 4J show respective processes in the method of manufacturing the magnetic sensor 2. Note that FIGS. 4D to 4J show the processes subsequent to FIG. 2C showing the method of manufacturing the magnetic sensor 1 in the first exemplary embodiment, and the processes proceed in the order of FIGS. 4D to 4J. FIGS. 4D to 4J correspond to the cross-sectional view shown in FIG. 3B. In other words, the method of manufacturing the magnetic sensor 2 shares the portion shown in FIGS. 2A to 2C with the method of manufacturing the magnetic sensor 1.

Figure 4D:
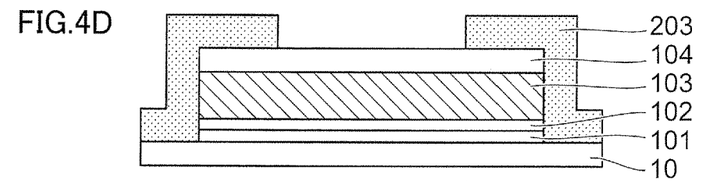
FIGS. 4D to 4J show respective processes in the method of manufacturing the magnetic sensor.

As shown in FIG. 4D, a resist pattern 203, which has openings serving as the portions where the sensitive elements 31 in the sensitive part 30 are formed, is formed on the substrate 10.

Figure 4E:
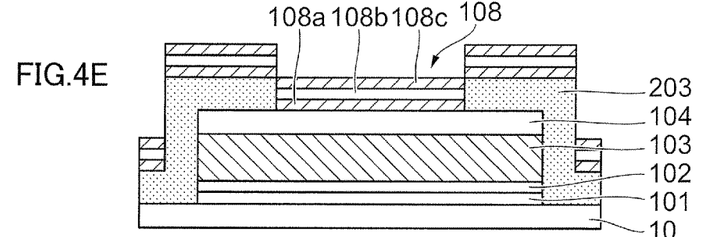

As shown in FIG. 4E, on the substrate 10, the lower soft magnetic material layer 108a made of the Co alloy, the demagnetizing field suppressing layer 108b made of Ru or the Ru alloy and the upper soft magnetic material layer 108c made of the Co alloy are deposited (accumulated).

Figure 4F:
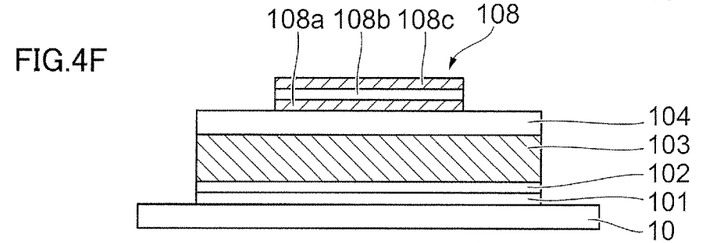

As shown in FIG. 4F, by removing the resist pattern 203, the lower soft magnetic material layer 108a, the demagnetizing field suppressing layer 108b and the upper soft magnetic material layer 108c that are accumulated on the resist pattern 203 are also removed (lift-off). Consequently, the sensitive elements 31 of the sensitive part 30 are formed.

Figure 4G:
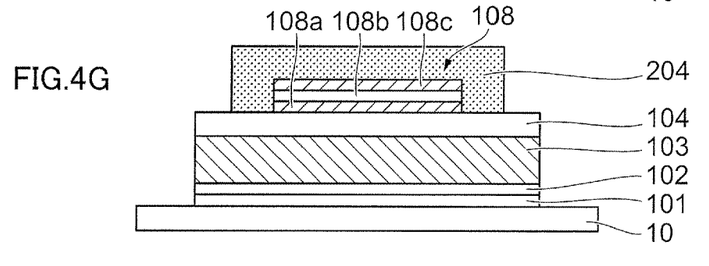

Next, as shown in FIG. 4G, a resist pattern 204, which has openings serving as the portions where the yokes 40 (the yoke 40a and 40b) are formed, is formed on the substrate 10.

Figure 4H:
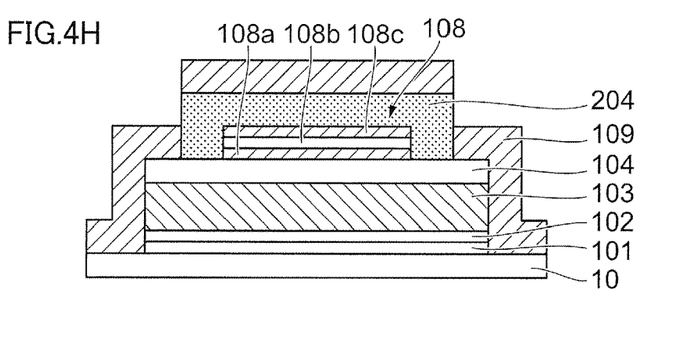

Then, as shown in FIG. 4H, a soft magnetic material layer 109 constituting the yokes 40 are deposited (accumulated) by the sputtering method or the like.

Figure 4I:
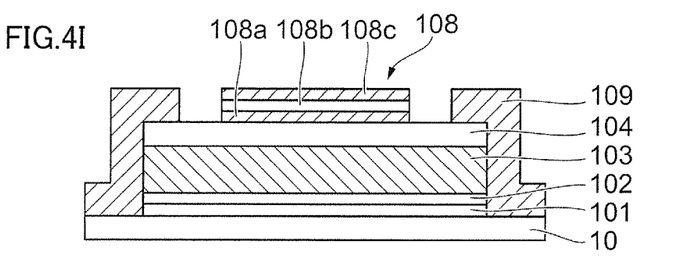
Figure 4J:
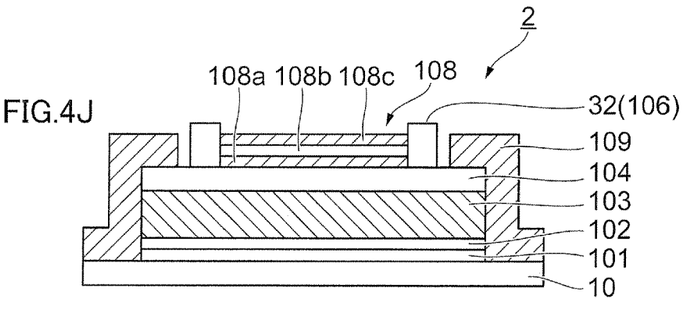

As shown in FIG. 4I, by removing the resist pattern 204, the soft magnetic material layer 109 accumulated on the resist pattern 204 is also removed (lift-off). Consequently, the yokes 40 (the yoke 40a and 40b) are formed.

Impartation of the uniaxial magnetic anisotropy to the magnetic material layer 108 of the sensitive part 30 and magnetization of the hard magnetic material layer 103 constituting the thin film magnet 20 are same as those in the first exemplary embodiment. Therefore, descriptions thereof will be omitted.

Third Exemplary Embodiment

In a magnetic sensor 3 to which a third exemplary embodiment is applied, the sensitive part 30 is similar to that of the second exemplary embodiment, and each of the yokes 40 is configured with two soft magnetic material layers provided with a demagnetizing field suppressing layer interposed therebetween. Hereinafter, portions different from those of the second exemplary embodiment will be mainly described, and similar portions will be assigned with same reference signs to thereby omit descriptions thereof.

(Magnetic Sensor 3)

Figure 5A:
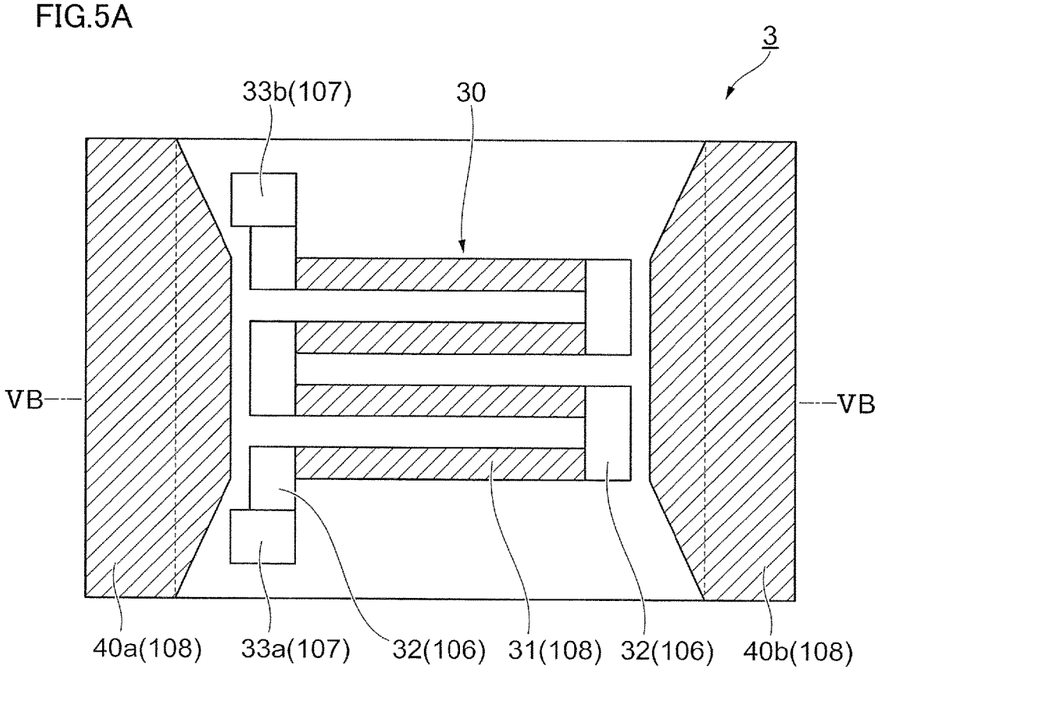
FIG. 5A is a plan view and FIG. 5B is a cross-sectional view along the VB-VB line in FIG. 5A.
Figure 5B:
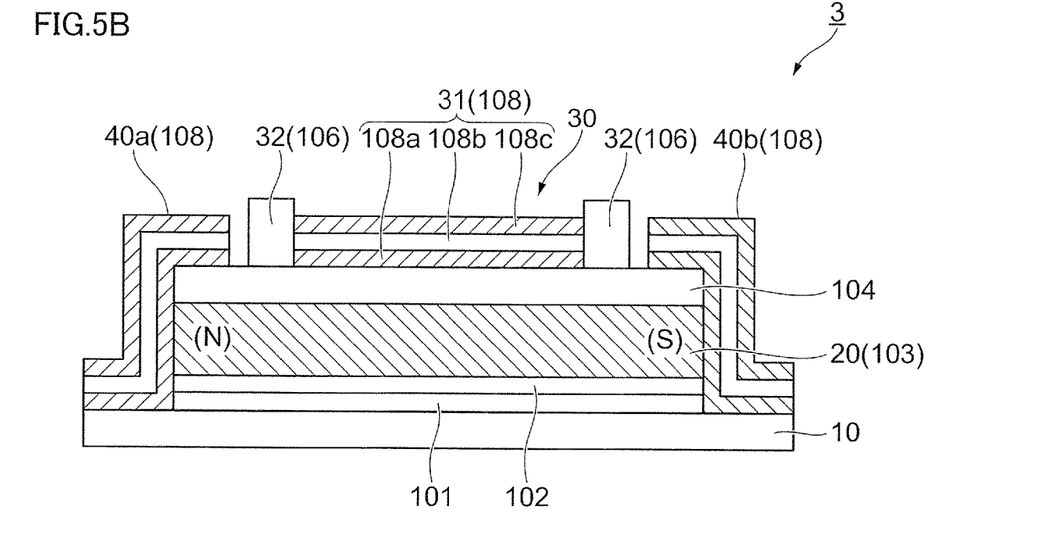

FIGS. 5A and 5B show diagrams illustrating an example of the magnetic sensor 3 to which the third exemplary embodiment is applied. FIG. 5A is a plan view and FIG. 5B is a cross-sectional view along the VB-VB line in FIG. 5A.

In the magnetic sensor 2, the yokes 40 (the yokes 40a and 40b) are different from those of the magnetic sensor 2 to which the second exemplary embodiment is applied.

As shown in FIG. 5B, in the magnetic sensor 3, the yokes 40 (the yokes 40a and 40b) are configured with the magnetic material layer 108, which is the same as sensitive elements 31 of the sensitive part 30 in the magnetic sensor 2 to which the second exemplary embodiment is applied. In other words, each of the yokes 40 (each of the yokes 40a and 40b) includes the lower soft magnetic material layer 108a on the lower layer (the substrate 10) side, the demagnetizing field suppressing layer 108b and the upper soft magnetic material layer 108c on the upper layer (opposite to the substrate 10) side.

By doing so, similar to the magnetic sensor 1 in the first exemplary embodiment, the method of manufacturing the magnetic sensor 3 forms the sensitive elements 31 of the sensitive part 30 and the yokes 40 (the yokes 40a and 40b) by a single deposition of the magnetic material layer 108. In other words, in FIG. 2E illustrating the method of manufacturing the magnetic sensor 1, the lower soft magnetic material layer 108a, the demagnetizing field suppressing layer 108b and the upper soft magnetic material layer 108c may be deposited (accumulated) in order instead of the soft magnetic material layer 105.

So far, the first to third exemplary embodiments have been described; however, various modifications may be available without deviating from the gist of the present invention.

REFERENCE SIGNS LIST 1, 2, 3 Magnetic sensor
10 Substrate
20 Thin film magnet
30 Sensitive part
31 Sensitive element
32 Connection member
33, 33a, 33b Electrode pad
40, 40a, 40b Yoke
101 Adhesive layer
102 Control layer
103 Hard magnetic material layer
104 Insulating layer
105, 109 Soft magnetic material layer
106, 107 Conductor layer
108 Magnetic material layer
108a Lower soft magnetic material layer
108b Demagnetizing field suppressing layer
108c Upper soft magnetic material layer
201 to 204 Resist pattern

The invention claimed is:

1. A magnetic sensor comprising:
   a thin film magnet that is configured with a hard magnetic material and has magnetic anisotropy in an in-plane direction;
   a sensitive part including a sensitive element that is configured with a soft magnetic material and is disposed to face the thin film magnet, the sensitive element having a longitudinal direction in which a magnetic flux generated by the thin film magnet passes through and a short direction, having uniaxial magnetic anisotropy in a direction that crosses the longitudinal direction; and
   a control layer that is disposed on a side of the thin film magnet, which is opposite to a side of the thin film magnet on which the sensitive element is provided, the control layer controlling the magnetic anisotropy of the thin film magnet to be directed in the in-plane direction.

2. The magnetic sensor according to claim 1, wherein the control layer has a body-centered cubic structure, the hard magnetic material constituting the thin film magnet has an hexagonal close-packed structure, and, in the hard magnetic material, crystal growth is conducted on the bcc structure of the control layer to cause a c-axis of the hcp structure to be oriented in-plane.

3. The magnetic sensor according to claim 1, wherein the control layer is made of Cr, Mo or W, or an alloy containing thereof.

4. The magnetic sensor according to claim 1, wherein the control layer is disposed on a nonmagnetic substrate provided with a groove along a direction connecting both magnetic poles of the thin film magnet.

5. The magnetic sensor according to claim 4, further comprising:
   an adhesive layer between the substrate and the control layer, the adhesive layer improving adhesiveness of the control layer to the substrate.

6. The magnetic sensor according to claim 1, wherein the sensitive element of the sensitive part is configured with a plurality of soft magnetic material layers, the soft magnetic material layers being antiferromagnetically-coupled with a demagnetizing field suppressing layer made of Ru or an Ru alloy interposed therebetween.

7. The magnetic sensor according to claim 1, wherein the sensitive part includes a plurality of the sensitive elements disposed in parallel, the plural sensitive elements being serially connected by at least one connection member configured with a conductor.

8. The magnetic sensor according to claim 1, further comprising:
   a yoke provided, from a magnetic pole of the thin film magnet, to face an end portion in the longitudinal direction of the sensitive element in the sensitive part to guide the magnetic flux generated from the thin film magnet to pass through the sensitive element in the longitudinal direction thereof.

9. A method of manufacturing a magnetic sensor comprising:
   a control layer formation process that forms a control layer on a nonmagnetic substrate, the control layer controlling magnetic anisotropy of a hard magnetic material layer to be formed on the control layer to be directed in an in-plane direction;
   a thin film magnet formation process that forms the hard magnetic material layer to serve as a thin film magnet on the control layer, the magnetic anisotropy of the hard magnetic material layer being controlled by the control layer to be directed in the in-plane direction; and
   a sensitive part formation process that forms a soft magnetic material layer to face the hard magnetic material layer with an insulating layer interposed therebetween, and forms a sensitive part including a sensitive element having uniaxial magnetic anisotropy in a direction crossing a direction in which a magnetic flux generated by the thin film magnet passes through.

10. The method of manufacturing a magnetic sensor according to claim 9, wherein the substrate in the control layer formation process has a groove formed thereon along a direction connecting both magnetic poles of the thin film magnet.

* * * * *